(12) United States Patent
Jung et al.

(10) Patent No.: US 8,486,732 B2
(45) Date of Patent: Jul. 16, 2013

(54) METHOD OF MANUFACTURING SEMICONDUCTOR LIGHT EMITTING DEVICE INCLUDING STEP OF PERFORMING ETCHING PROCESS WITH RESPECT TO CONDUCTIVE SUPPORT MEMBER

(75) Inventors: Joo Yong Jung, Gwangju (KR); Young Kyu Jeong, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 57 days.

(21) Appl. No.: 13/095,173

(22) Filed: Apr. 27, 2011

(65) Prior Publication Data
US 2011/0201140 A1    Aug. 18, 2011

Related U.S. Application Data

(62) Division of application No. 12/796,780, filed on Jun. 9, 2010, now Pat. No. 7,956,379.

(30) Foreign Application Priority Data

Jun. 10, 2009   (KR)  ....................... 10-2009-0051249

(51) Int. Cl.
*H01L 33/52*      (2010.01)
(52) U.S. Cl.
USPC .......................................................... 438/26
(58) Field of Classification Search
USPC .................. 257/99, 620; 438/26–29
See application file for complete search history.

(56) References Cited

U.S. PATENT DOCUMENTS

| | | | |
|---|---|---|---|
| 7,626,211 B2 * | 12/2009 | Sugiura et al. .................. | 257/99 |
| 2003/0189212 A1 | 10/2003 | Yoo ................................. | 257/79 |
| 2004/0235210 A1 | 11/2004 | Tamura et al. .................. | 438/22 |
| 2006/0071230 A1 | 4/2006 | Lee et al. ........................ | 257/103 |
| 2008/0006837 A1 | 1/2008 | Park et al. ....................... | 257/98 |
| 2008/0017876 A1 | 1/2008 | Lin .................................. | 257/98 |
| 2008/0067634 A1 * | 3/2008 | Swee Seng .................... | 257/620 |
| 2009/0091001 A1 * | 4/2009 | Park ............................... | 257/620 |

FOREIGN PATENT DOCUMENTS

| | | |
|---|---|---|
| JP | 2007-081088 A | 3/2007 |
| KR | 10-2007-0044099 A | 4/2007 |
| KR | 10-2007-0093556 A | 9/2007 |
| KR | 10-2008-0087135 A | 9/2008 |

OTHER PUBLICATIONS

Korean Notice of Allowance dated Aug. 16, 2010 issued in Application No. 10-2009-0051249.
Notice of Allowance dated Jan. 28, 2011 issued in U.S. Appl. No. 12/796,780.
European Search Report dated May 2, 2012 issued in Application No. 10 16 5238.

* cited by examiner

*Primary Examiner* — Nathan Ha
(74) *Attorney, Agent, or Firm* — KED & Associates, LLP

(57) ABSTRACT

Disclosed are a light emitting device, a method of manufacturing the same, a light emitting device package, and a lighting system. The light emitting device includes a conductive support member, a light emitting structure layer including a first conductive semiconductor layer, an active layer, and a second conductive semiconductor layer on the conductive support member, and an electrode on the light emitting structure layer. The conductive support member has a curved lateral surface recessed inward.

20 Claims, 8 Drawing Sheets

METHOD OF MANUFACTURING SEMICONDUCTOR LIGHT EMITTING DEVICE INCLUDING STEP OF PERFORMING ETCHING PROCESS WITH RESPECT TO CONDUCTIVE SUPPORT MEMBER

CROSS-REFERENCE TO RELATED APPLICATIONS

This application is a Divisional Application of prior U.S. patent application Ser. No. 12/796,780 filed Jun. 9, 2010, which claims priority under 35 U.S.C. §119 to Korean Application No. 10-2009-051249 filed on Jun. 10, 2009, whose entire disclosures are hereby incorporated by reference.

BACKGROUND

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

SUMMARY

The embodiment provides a light emitting device having a novel structure, a method of manufacturing the same, a light emitting device package, and a lighting system.

The embodiment provides a light emitting device, a method of manufacturing the same, a light emitting device package, and a lighting system, capable of improving a yield rate by performing an etching process after a laser scribing process has been carried out.

According to the embodiment, a light emitting device includes a conductive support member, a light emitting structure layer including a first conductive semiconductor layer, an active layer, and a second conductive semiconductor layer on the conductive support member, and an electrode on the light emitting structure layer. The conductive support member has a curved lateral surface recessed inward.

A light emitting device package includes a package body, first and second electrode layers on the package body, a light emitting device mounted on the package body and electrically connected to a first electrode layer and a second electrode layer, and a molding member surrounding the light emitting device. The light emitting device includes a conductive support member, a light emitting structure layer, which includes a first conductive semiconductor layer, an active layer, and a second conductive semiconductor layer on the conductive support member, and an electrode on the light emitting structure layer. The conductive support member has a curved lateral surface recessed inward.

According to the embodiment, a lighting system includes a substrate, and a light emitting device mounted on the substrate. The light emitting device includes a conductive support member, a light emitting structure layer, which includes a first conductive semiconductor layer, an active layer, and a second conductive semiconductor layer on the conductive support member, and an electrode on the light emitting structure layer. The conductive support member has a curved lateral surface recessed inward.

According to the embodiment, a method of manufacturing a light emitting device includes forming a light emitting structure layer, which includes a first conductive semiconductor layer, an active layer, and a second conductive semiconductor layer, on a growth substrate, selectively forming a protective layer on the light emitting structure layer, forming a conductive support member on the light emitting structure layer and the protective layer, removing the growth substrate from the light emitting structure layer, forming a chip boundary region by performing an isolation etching with respect to the light emitting structure layer such that the light emitting structure layer is divided into a plurality of chip units, forming a separating section, by which the conductive support is divided into separate portions, by performing a laser scribing process with respect to the chip boundary region while passing through the conductive support member, performing an etching process with respect to the separating section, and dividing the light emitting structure layer and the conductive support member in a chip unit by breaking the conductive support member.

The embodiment can provide a light emitting device having a novel structure, a method of manufacturing the same, a light emitting device package, and a lighting system.

The embodiment can provide a light emitting device, a method of manufacturing the same, a light emitting device package, and a lighting system, capable of improving a yield rate by performing an etching process after a laser scribing process has been carried out.

DETAILED DESCRIPTION

Hereinafter, the embodiment will be described with reference to accompanying drawings. In the description of the embodiments, the concept of the term "on each layer" or "under each layer" will be described with reference to accompanying drawings. Meanwhile, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

FIGS. 1 to 11 are sectional views showing a light emitting device and a method of manufacturing the same according to the embodiment.

Figure 1:
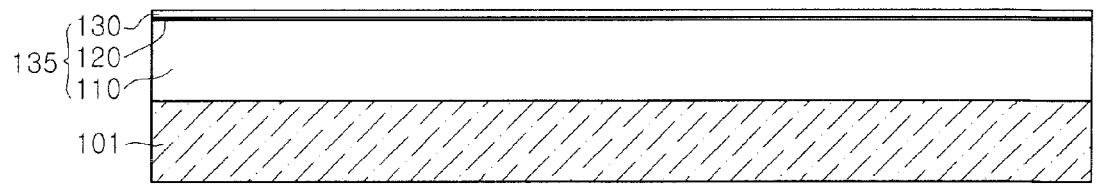
FIGS. 1 to 11 are sectional views showing a light emitting device and a method of manufacturing the same according to the embodiment.

Referring to FIG. 1, a light emitting structure layer 135 is formed on a growth substrate 101. The light emitting structure layer 135 includes a first conductive semiconductor layer 110, an active layer 120 on the first conductive semiconductor layer 110, and a second conductive semiconductor layer 130 on the active layer 120.

The growth substrate 101 may include one of sapphire ($Al_2O_3$), GaN, SiC, ZnO, Si, GaP, InP, or GaAs. A buffer layer and/or an undoped semiconductor layer may be formed on the growth substrate 101.

The light emitting structure layer 135 may include a GaN-based semiconductor layer. The light emitting structure layer 135 may include at least one of GaN, InGaN, AlGaN, or InAlGaN.

The first conductive semiconductor layer 110 may include an N-type semiconductor layer. The first conductive semiconductor layer 110 may include a semiconductor material having a composition formula of $In_xAl_yGa_{1-x-y}N$ ($0 \leq x \leq 1$, $0 \leq y \leq 1$, $0 \leq x+y \leq 1$). For example, the first conductive semiconductor layer 110 may include InAlGaN, GaN, AlGaN, AlInN, InGaN, AlN, or InN. The first conductive semiconductor layer 110 may be doped with N-type dopants such as Si, Ge, and Sn.

Electrons (or holes) injected through the first conductive semiconductor layer 110 meet holes (or electrons) injected through the second conductive semiconductor layer 130 at the active layer 120, so that the active layer 120 emits the light based on the band gap difference of the energy band according to material of the active layer 120.

The active layer 120 may have one of a single quantum structure, a multi-quantum well structure, a quantum dot structure, and a quantum wire structure, but the embodiment is not limited thereto.

The active layer 120 may include a semiconductor material having a composition formula of $In_xAl_yGa_{1-x-y}N$ ($0 \leq x \leq 1$, $0 \leq y \leq 1$, $0 \leq x+y \leq 1$). If the active layer 120 is formed in the MQW structure, the active layer 120 may have a stack structure of plural well layers and plural barrier layers. For instance, the active layer 120 may have a stack structure of an InGaN well layer/a GaN barrier layer.

A clad layer (not shown) doped with n-type dopants or p-type dopants may be formed above and/or below the active layer 120, and may include an AlGaN layer or an InAlGaN layer.

For example, the second conductive semiconductor layer 130 may include a P-type semiconductor layer. The second conductive semiconductor layer 130 may include a semiconductor material having a composition formula of $In_xAl_yGa_{1-x-y}N$ ($0 \leq x \leq 1$, $0 \leq y \leq 1$, $0 \leq x+y \leq 1$). For example, the second conductive semiconductor layer 130 may include InAlGaN, GaN, AlGaN, InGaN, AlInN, AlN, or InN. The second conductive semiconductor layer 130 may include P-type dopants such as Mg, Zn, Ca, Sr, and Ba.

Meanwhile, the first conductive semiconductor layer 110 may include a P-type semiconductor layer, and the second conductive semiconductor layer 130 may include an N-type semiconductor layer. A third conductive semiconductor layer (not shown) including an N-type semiconductor layer or a P-type semiconductor layer may be formed on the second conductive semiconductor layer 130. Accordingly, the light emitting structure layer 135 may have at least one of NP, PN, NPN, or PNP junction structures. The doping density of dopants of the first and second conductive semiconductor layers 110 and 130 may be regular or irregular. In other words, the light emitting structure layer 135 may have various structures, but the embodiment is not limited thereto.

The light emitting structure layer 135 including the first conductive semiconductor layer 110, the active layer 120, and the second conductive semiconductor layer 130 may have variously modified structures. In other words, the light emitting structure layer 135 is not limited to the above structure according to the embodiment.

In a method of manufacturing the light emitting device according to the embodiment, a plurality of light emitting device chips may be provided together. Hereinafter, only regions corresponding to first and second chips will be described for the purpose of explanation.

Figure 2:
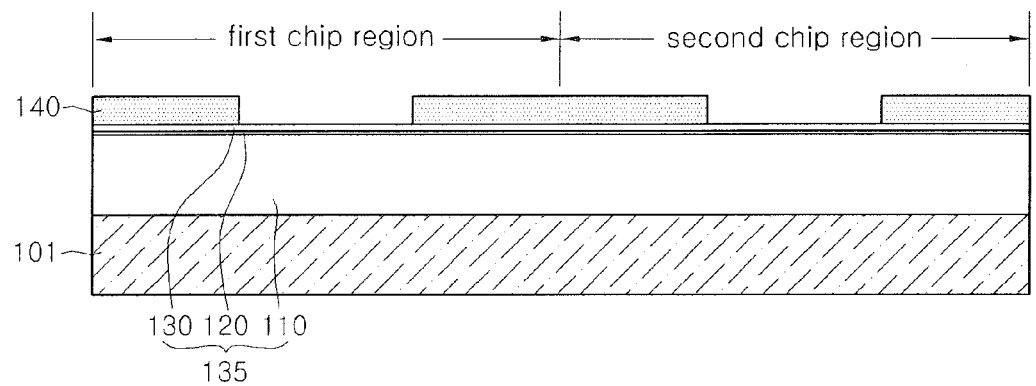

Referring to FIG. 2, protective layer 140 is selectively formed on the second conductive semiconductor layer 130.

For example, the protective layer 140 may be selectively formed on the second conductive semiconductor layer 130 along outer peripheral portions of the first and second chip regions.

The protective layer 140 may include an insulating material or a material that does not generate fragments in an isolation etching process. For example, the protective layer 140 may include at least one of $SiO_2$, $SiO_x$, $Si_xN_y$, $Al_2O_3$, $TiO_2$, ITO, IZO, or AZO. The protective layer 140 can prevent the light emitting structure layer 135 from being electrically shorted in the isolation etching process.

Figure 3:
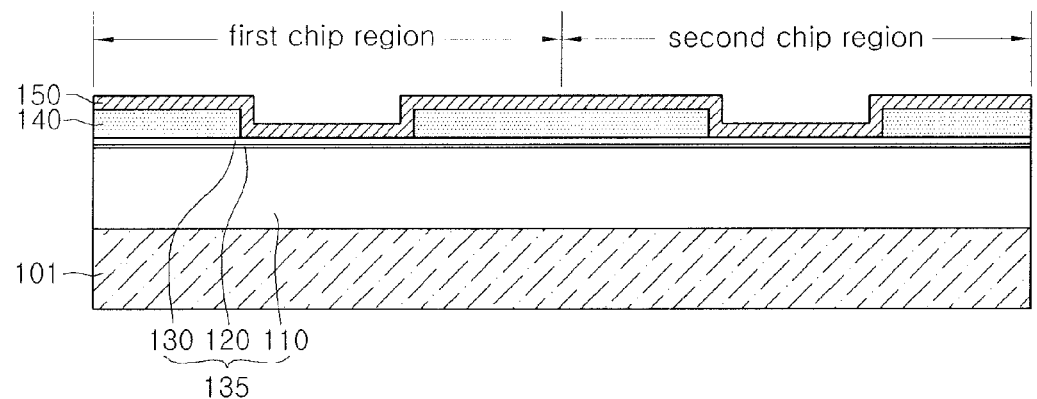

Referring to FIG. 3, a contact layer 150 is formed on the second conductive semiconductor layer 130. In addition, the contact layer 150 may be formed on the protective layer 140.

The contact layer 150 may include at least one of Al, Ag, Pd, Rh, or Pt, or the alloy thereof. In addition, the contact layer 150 may include a material having an ohmic contact property or high reflection efficiency.

Figure 4:
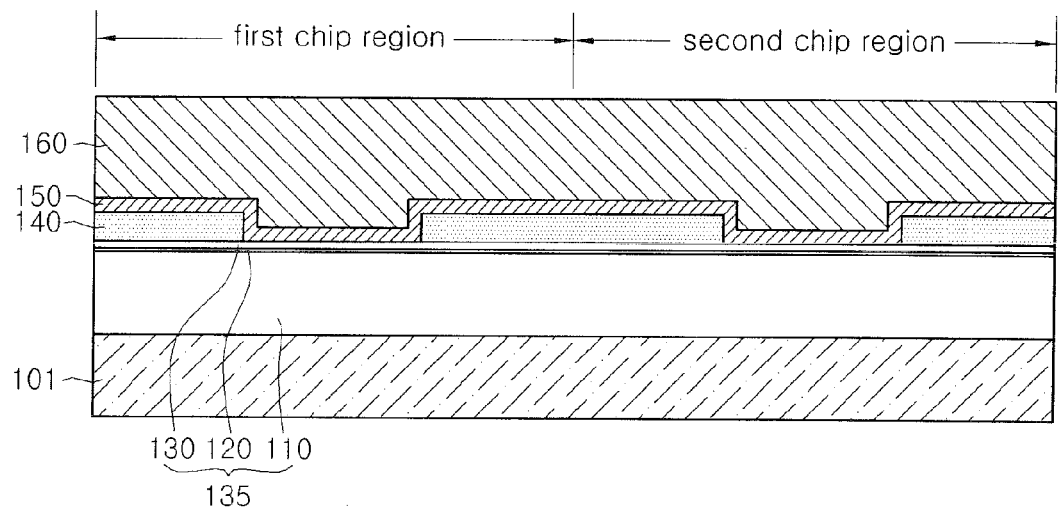

Referring to FIG. 4, a conductive support member 160 is formed on the contact layer 150.

The conductive support member 160 may include at least one of copper (Cu), titanium (Ti), chromium (Cr), nickel (Ni), aluminum (Al), platinum (Pt), gold (Au), molybdenum (Mo), and a carrier wafer including Si, Ge, GaAs, ZnO, SiGe, GaN, or $Ga_2O_3$. The conductive support member 160 serves as a base substrate. For example, the conductive support member 160 may be formed through a plating process or a bonding process. The thickness of the conductive support member 160 may be in the range of about 10 μm to about 500 μm.

The conductive support member 160 supports the light emitting structure layer 135.

The contact layer 150 and the conductive support member 160 may be formed as one layer. For example, the contact layer 150 and the conductive support member 160 may be prepared as a support member having high reflectance, but the embodiment is not limited thereto.

Figure 5:
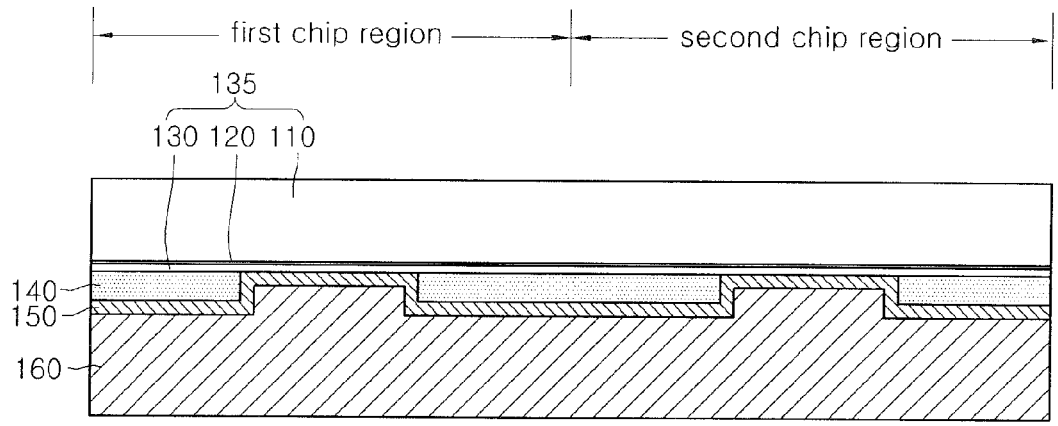

Referring to FIG. 5, the growth substrate 101 is removed. The growth substrate 101 may be removed through a laser lift off (LLO) scheme or a chemical lift off (CLO) scheme.

According to the LLO scheme, a laser beam having a predetermined wavelength band is irradiated into the growth substrate 101 to separate the growth substrate 101. In addition, if another semiconductor layer (e.g., buffer layer) is formed between the growth substrate 101 and the first conductive semiconductor layer 110, the CLO scheme may be employed to remove the buffer layer using wet etchant.

Then, a surface of the first conductive semiconductor layer 110 without the growth substrate 101 may be polished through a polisher.

For reference, the structure of FIG. 5 is obtained by reversing the structure of FIG. 4.

Figure 6:
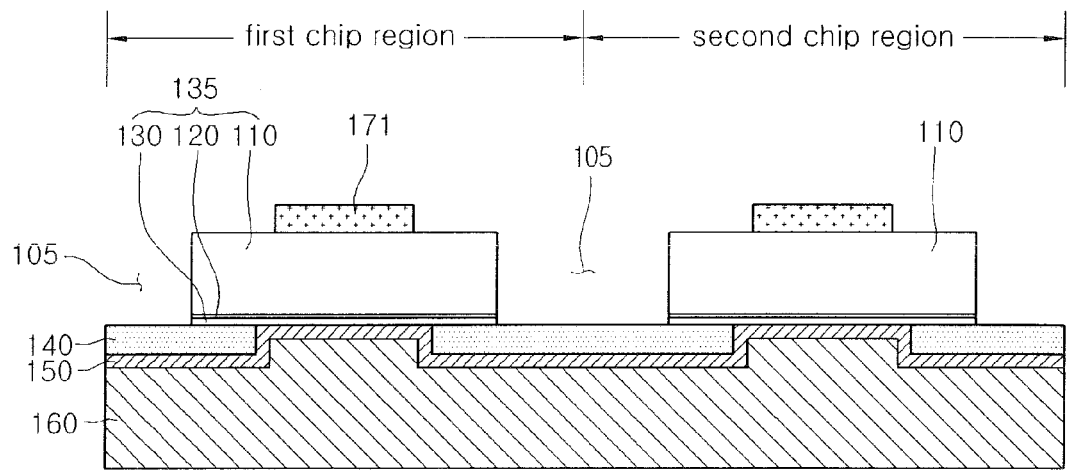

Referring to FIG. 6, an isolation etching process is performed with respect to the light emitting structure layer 135 to selectively remove the light emitting structure layer 135, so that a chip boundary region 105 is formed. The light emitting structure layer 135 is divided into a plurality of chip units by the chip boundary region 105. For example, the light emitting structure layer 135 may be divided into first and second chips. The isolation etching process may be performed in the chip boundary region 105 such that the protective layer 140 may be exposed, but the embodiment is not limited thereto.

In addition, an electrode 171 may be formed in a predetermined pattern on the first conductive semiconductor layer 110.

Figure 7:
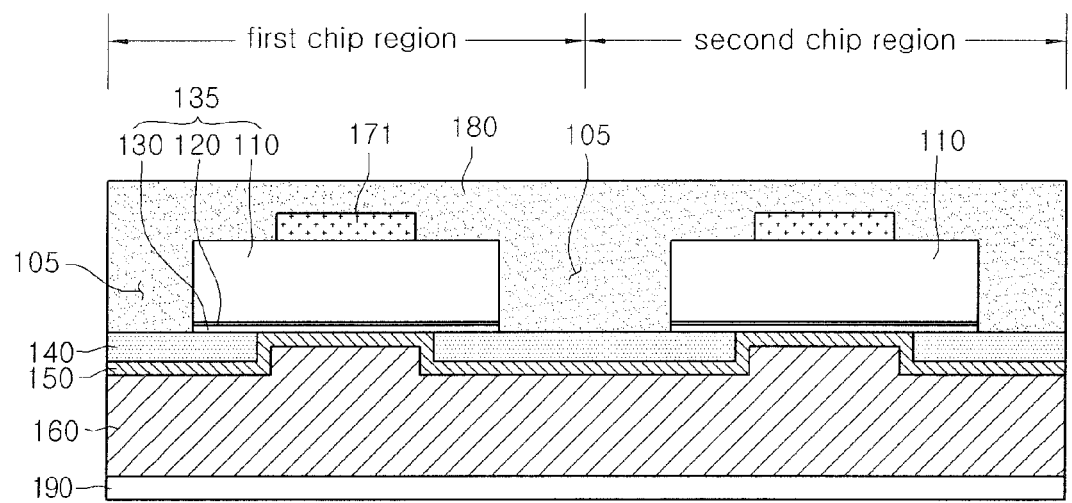

Referring to FIG. 7, a first chip protective layer 180 may be formed on the light emitting structure layer 135 and the protective layer 140, and a first support layer 190 may be formed under the conductive support member 160.

The first chip protective layer 180 prevents the light emitting structure layer 135 from being damaged when the LLO process is performed to form an individual chip. The first support layer 190 supports the light emitting structure layer 135 and the conductive support member 160 when the LLO process is performed.

The first chip protective layer 180 and the first support layer 190 may be omitted or added if necessary. For example, a chip protective layer may be additionally interposed between the conductive support member 160 and the first support layer 190.

The first chip protective layer 180 may include a photoresist layer, but the embodiment is not limited thereto.

The first support layer 190 may be provided in the form of an adhesive sheet such as a UV sheet or a blue sheet, having an adhesion property, but the embodiment is not limited thereto.

Figure 8:
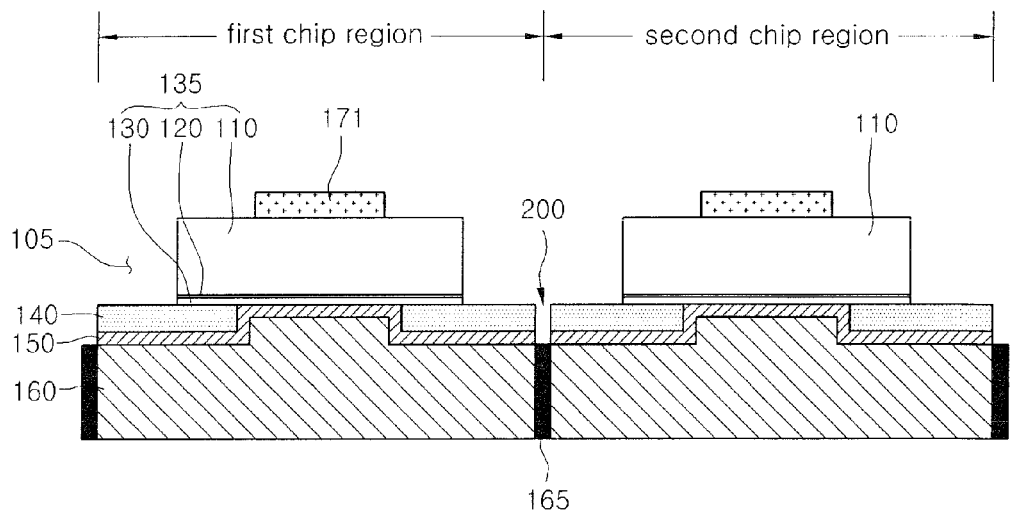

Referring to FIG. 8, a laser scribing process is performed along the chip boundary region 105 through the first chip protective layer 180, the protective layer 140, the contact layer 150, and the conductive support member 160, thereby forming a separating section 200 to separate chip regions from each other in a chip unit. As shown in FIG. 8, the separating section 200 may be formed to separate the first and second chips from each other.

In this case, the separating section 200 partially separates the first and second chips from each other. Although the conductive support member 160 is melted during the laser scribing process, the melted conductive support member 160 is cured to form a re-combination section 165 after the laser scribing process has been finished.

The re-combination section 165 partially connects the conductive support members 160 to each other, and the thickness of the re-combination section 165 is increased as the thickness of the conductive support member 160 is increased.

The first chip protective layer 180 and the first support layer 190 may be removed after the laser scribing process.

Figure 9:
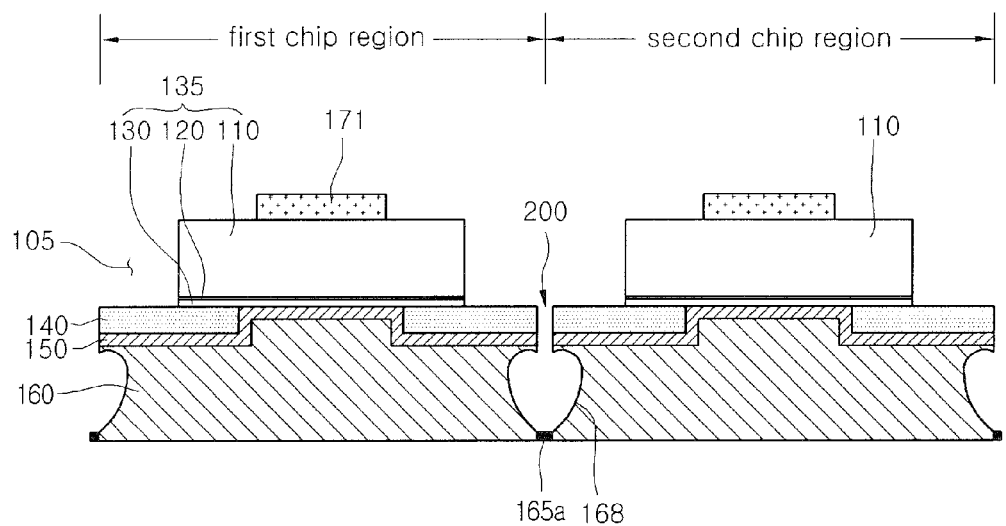

Referring to FIG. 9, an etching process is performed with respect to the separating section 200 to remove at least a portion of the re-combination section 165, so that a sub-recombination section 165a remains as shown in FIG. 9.

The etching process may include wet etching employing a chemical solution as etchant, and dry etching employing gas as etchant.

FIG. 9 shows a case in which the wet etching is used. When the wet etching is performed, an etch profile of the separating section 200, that is, a lateral surface 168 of the conductive support member 160 becomes a curved surface recessed inward. This is because the wet etching can be performed as isotropic etching having no specific orientation.

The etch profile, that is, the lateral surface 168 of the conductive support member 160 is more recessed as the contact with the etchant is increased. For example, when the etching process is performed from a top surface of the conductive support member 160, the lateral surface 168 of the conductive support member 160 is recessed at an upper portion more than at a lower portion.

If dry etching is performed, etching can be achieved with a uniform orientation. Accordingly, different from the wet etching, the conductive support member 160 may not have the curved lateral surface 168 recessed inward. However, the dry etching may be slowly performed.

Figure 10:
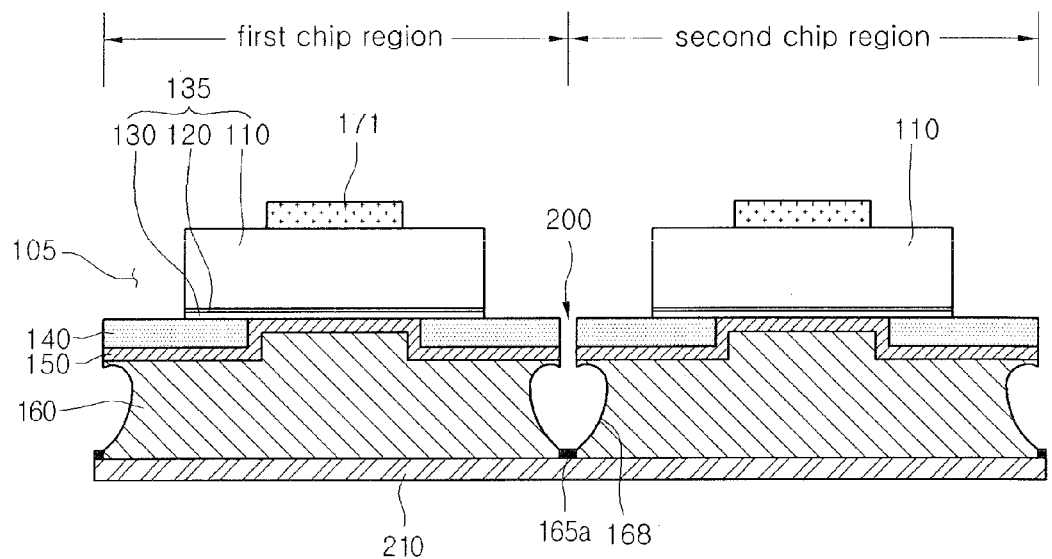

Referring to FIG. 10, a second support layer 210 may be formed under the conductive support member 160.

The second support layer 210 may be provided in the form of an adhesive sheet, such as a UV sheet or a blue sheet, having an adhesion property, but the embodiment is not limited thereto.

When the light emitting device is divided into separate portions in a chip unit through a breaking process that will be described later, the second support layer 210 fixes the separate portions of the light emitting device such that the separate portions of the light emitting device are not scattered.

Meanwhile, a second protective layer (not shown) is formed on the light emitting structure layer 135 and the electrode 171, thereby protecting the light emitting device in the following breaking process.

Figure 11:
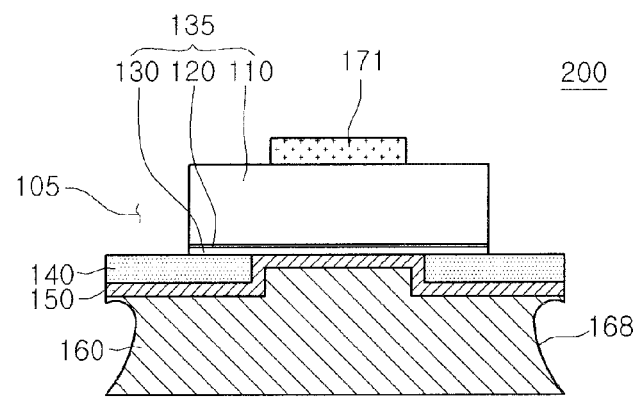

Referring to FIGS. 10 and 11, the breaking process is performed with respect to the separating section 200 to separate a plurality of chips from each other in a chip unit. As shown in FIGS. 10 and 11, the first and second chips are separated from each other through the breaking process.

According to the breaking process, the re-combination section 165 of the separating section 200 is cut by using a cutter, so that the first and second chips are completely separated from each other in a chip unit.

However, since the breaking process employs the cutter, cracks may occur in the light emitting device when the re-combination section 165 of the separating section 200 is cut.

In particular, as described above, the thickness of the re-combination section 165 becomes increased as the thickness of the conductive support member 160 is increased. Accordingly, if the breaking process is directly performed with respect to the separating section 200 without the etching process according to the embodiment, the probability of the failure of the light emitting device resulting from cracks is increased as the thickness of the re-combination section 165 is increased.

For example, if the thickness of the conductive support member 160 is about 75 μm, the yield rate in the manufacturing process of the light emitting device is in the range of about 70% to about 80%. However, if the thickness of the conductive support member 160 exceeds 150 μm, the yield rate in the manufacturing process of the light emitting device approximates 0%.

However, since an etching process is performed with respect to the separating section 200 to remove at least a portion of the re-combination section 165, the thickness of the re-combination section 165 is reduced, so that defects caused by the breaking process can be lowered, and the yield rate in the manufacturing process of the light emitting device can be improved.

In particular, the etching process according to the embodiment may be performed when the thickness of the conductive support member 160 is in the range of about 75 μm to about 500 μm. Even if the conductive support member 160 has a thick thickness, the yield rate in the manufacturing process of the light emitting device can be improved.

In other words, according to the embodiment, the thickness of the conductive support member 160 may be in the range of about 75 µm to about 500 µm.

The second support layer 210 and the second chip protective layer (not shown) may be removed after the breaking process has been performed.

Therefore, the light emitting device according to the embodiment can be provided.

The light emitting device according to the embodiment includes the conductive support member 160, the light emitting structure layer 135 on the conductive support member 160, and the electrode 171 on the light emitting structure layer 135.

A portion of the protective layer 140 may be provided between the conductive support member 160 and the light emitting structure layer 135, and the portion of the protective layer 140 may be exposed upwardly.

A contact layer 150 may be interposed between the light emitting structure layer 135 and the conductive support member 160, and may be simultaneously interposed between the protective layer 140 and the conductive support member 160.

The conductive support member 160 may have the curved lateral surface 168 recessed inward. The lateral surface 168 of the conductive support member 160 may vertically overlap with the protective layer 140.

Figure 12:
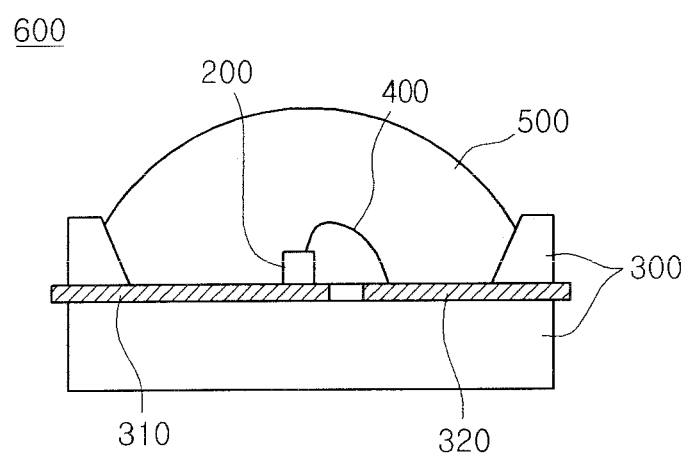
FIG. 12 is a view showing a light emitting device package including a light emitting device according to embodiments.

FIG. 12 is a sectional view showing a light emitting device package 600 having the light emitting device according to the embodiments.

Referring to FIG. 12, the light emitting device package 600 according to the embodiment includes a package body 300, first and second electrode layers 310 and 320 formed on the package body 300, the light emitting device 200 provided on the package body 300 and electrically connected to the first and second electrode layers 31 and 32 and a molding member 500 that surrounds the light emitting device 200.

The package body 300 may include one of silicon, synthetic resin or metallic material. An inclined surface may be formed around the light emitting device 200.

The first and second electrode layers 310 and 320 are electrically isolated from each other to supply power to the light emitting device 200. In addition, the first and second electrode layers 310 and 320 reflect the light emitted from the light emitting device 200 to improve the light efficiency and dissipate heat generated from the light emitting device 200 to the outside.

The light emitting device 200 can be installed on the package body 300 or the first and second electrode layers 310 and 320.

The light emitting device 200 is electrically connected to the first and second electrode layers 310 and 320 through a wire 400.

The molding member 500 surrounds the light emitting device 200 to protect the light emitting device 200. In addition, the molding member 500 may include phosphors to change the wavelength of the light emitted from the light emitting device 200.

Since the light emitting device package 600 according to the embodiment includes the light emitting device 200 in which the damage of a light emitting structure layer is less, the light emitting device package 600 may represent superior light emission efficiency.

A plurality of the light emitting device packages 600 according to the embodiment are arrayed on a substrate, and a light guide plate, a prism sheet, a diffusion sheet, and a fluorescent sheet, which are optical members, may be provided on a path of light emitted from the light emitting device packaae 600. The light emitting device package, the substrate, and the optical members constitute a backlight unit or a lighting unit. For example, a lighting system may include the backlight unit, the lighting unit, an indicator, a lamp, and a street lamp.

Figure 13:
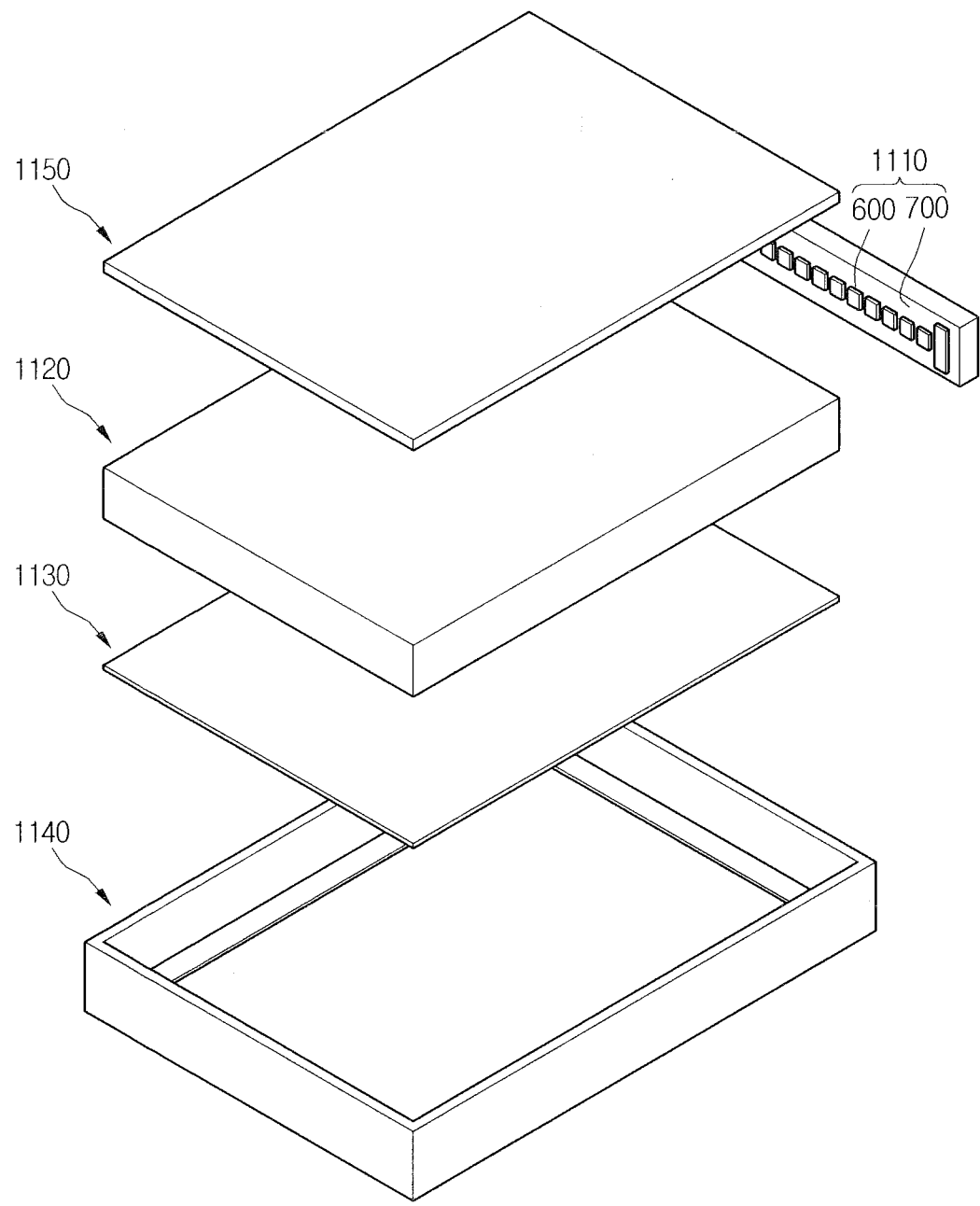
FIG. 13 is a view showing a backlight unit including a light emitting device or a light emitting device package according to the embodiment.

FIG. 13 is an exploded perspective view showing a backlight unit 1100 including the light emitting device or the light emitting device package according to the embodiment. The backlight unit 1100 shown in FIG. 13 is an example of a lighting system, but the embodiment is not limited thereto.

Referring to FIG. 13, the backlight unit 1100 includes a bottom frame 1140, a light guide member 1120 installed in the bottom frame 1140, and a light emitting module 1110 installed at one lateral surface or on the bottom surface of the light guide frame 1120. In addition, a reflective sheet 1130 is disposed under the light guide member 1120

The bottom frame 1140 has a box shape having a top surface being open to receive the light guide member 1120, the light emitting module 1110 and the reflective sheet 1130 therein. In addition, the bottom frame may include metallic material or resin material, but the embodiment is not limited thereto.

The light emitting module 1110 may include a substrate 700 and a plurality of light emitting device packages 600 installed on the substrate 700. The light emitting device packages 600 provide the light to the light guide member 1120. According to the embodiment, although the light emitting module 1110 includes the light emitting device package 600 provided on the substrate 700, the light emitting device 200 according to the embodiment may be directly installed in the light emitting module 1110.

As shown in FIG. 13, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100, but the embodiment is not limited thereto.

The light guide member 1120 may be installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate may include one selected from the group consisting of acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 may have a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on a display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmissive plate or a transmissive film including phosphors.

The reflective sheet 1130 may be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 14:
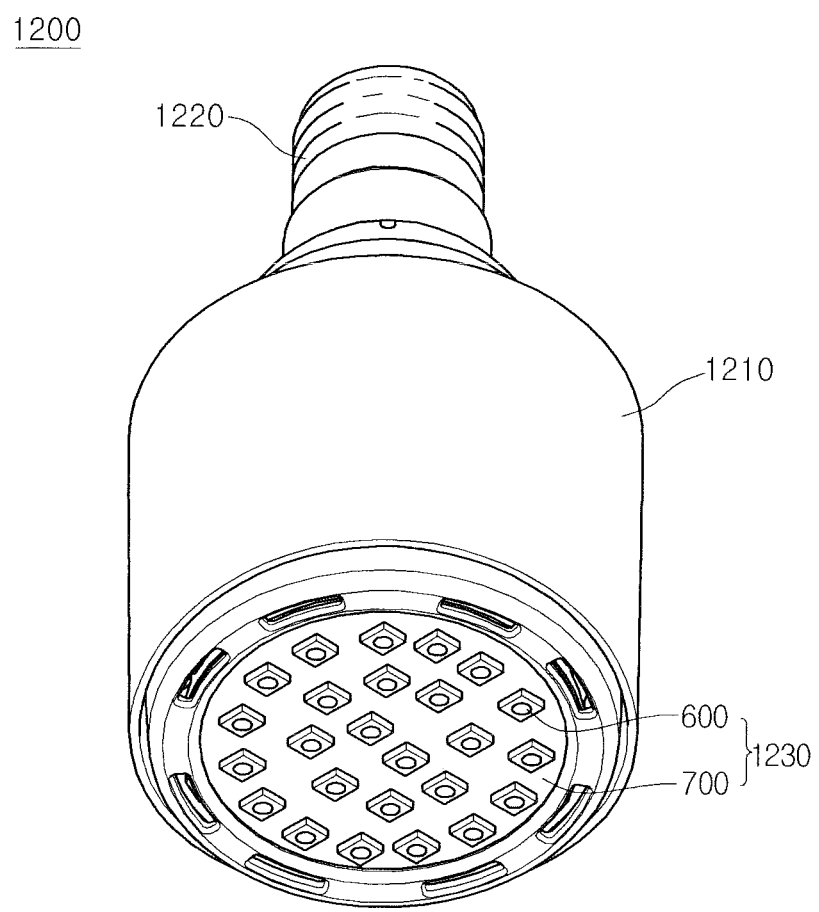
FIG. 14 is a lighting system including a light emitting device or a light emitting device package according to the embodiment.

FIG. 14 is a perspective view showing a lighting unit 1200 including a light emitting device or a light emitting device package according to the embodiment. The illumination unit 1200 shown in FIG. 14 is an example of a lighting system, but the embodiment is not limited thereto.

Referring to FIG. 14, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting device package 600 installed on the substrate 700. According to the embodiment, although the light emitting module 1110 according to the embodiment includes the light emitting device package 600 provided on the substrate 700, the light emitting device 200 may be directly installed in the light emitting module 1110.

The substrate 700 includes an insulating member printed with a circuit pattern. For instance, the substrate 300 includes a PCB (printed circuit board), an MC (metal core) PCB, an F (flexible) PCB, or a ceramic PCB.

In addition, the substrate 700 may include material that effectively reflects the light. The surface of the substrate 300 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the combination of the white LED, the red LED and the green LED can be arranged to achieve the high color rendering index (CRI). In addition, a fluorescent sheet may further be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 14, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor light emitting device, the method comprising:
    forming a light emitting structure;
    selectively forming a light emitting region protective layer under the light emitting structure, the light emitting region protective layer formed of an insulating material;
    forming an electrode layer under the light emitting structure and the light emitting region protective layer;
    forming a conductive support member under the electrode layer;
    forming a chip boundary region among a plurality of chips by mesa-etching the light emitting structure to expose the light emitting region protection layer;
    forming a first boundary which groups the chips into chip units along the chip boundary region and extends by passing through the conductive support member;
    performing an etching process with respect to the conductive support member on the first boundary; and
    performing a breaking process to separate the chips into the chip units.

2. The method as claimed in claim 1, wherein the light emitting region protective layer is selectively formed under the light emitting structure along an outer peripheral portion of each chip.

3. The method as claimed in claim 1, wherein the conductive support member has a thickness of about 10 μm to about 500 μm.

4. The method as claimed in claim 1, further comprising forming at least one of a first support layer under the conductive support member and a first chip protective layer on the light emitting structure after forming the chip boundary region.

5. The method as claimed in claim 1, further comprising forming a second support layer on a bottom surface of the conductive support member after performing an etching process on the first boundary.

6. The method as claimed in claim 5, further comprising forming a second chip protective layer on the light emitting structure.

7. The method as claimed in claim 1, wherein the light emitting structure is formed on a substrate, and the substrate is removed after the conductive support member is formed under the electrode layer.

8. The method as claimed in claim 1, wherein the first boundary is formed through laser irradiation.

9. The method as claimed in claim 1, wherein the etching process includes a wet etching process or a dry etching process.

10. The method as claimed in claim 9, wherein, when the wet etching process is performed, a curved surface, which is recessed inward, is formed on a lateral side of the conductive support member.

11. The method as claimed in claim 1, wherein the conductive support member is formed of at least one of Cu, Au, or Mo.

12. A method of manufacturing a semiconductor light emitting device, the method comprising:
forming a light emitting structure;
selectively forming a light emitting region protective layer under the light emitting structure;
forming an electrode layer under the light emitting structure and the light emitting region protective layer;
forming a conductive support member under the electrode layer, the conductive support member formed of at least one of Cu, Au, or Mo;
forming a chip boundary region among a plurality of chips by mesa-etching the light emitting structure;
forming a first boundary which groups the chips into chip units along the chip boundary region and extends by passing through the conductive support member;
performing an wet etching process with respect to the conductive support member on the first boundary so that a curved surface, which is recessed inward, is formed on a lateral side of the conductive support member; and
performing a breaking process to separate the chips into the chip units.

13. The method as claimed in claim 12, wherein the light emitting region protective layer is selectively formed under the light emitting structure along an outer peripheral portion of each chip.

14. The method as claimed in claim 12, wherein the conductive support member has a thickness of about 10 μm to about 500 μm.

15. The method as claimed in claim 12, further comprising forming at least one of a first support layer under the conductive support member and a first chip protective layer on the light emitting structure after forming the chip boundary region.

16. The method as claimed in claim 12, further comprising forming a second support layer on a bottom surface of the conductive support member after performing an etching process on the first boundary.

17. The method as claimed in claim 16, further comprising forming a second chip protective layer on the light emitting structure.

18. The method as claimed in claim 12, wherein the light emitting structure is formed on a substrate, and the substrate is removed after the conductive support member is formed under the electrode layer.

19. The method as claimed in claim 12, wherein the first boundary is formed through laser irradiation.

20. The method as claimed in claim 12, wherein the light emitting region protective layer is formed of an insulating material.

* * * * *